United States Patent
Dakshina-Murthy et al.

(10) Patent No.: US 7,449,348 B1
(45) Date of Patent: *Nov. 11, 2008

(54) FEEDBACK CONTROL OF IMPRINT MASK FEATURE PROFILE USING SCATTEROMETRY AND SPACER ETCHBACK

(75) Inventors: Srikanteswara Dakshina-Murthy, Wappingers Falls, NY (US); Bhanwar Singh, Morgan Hill, CA (US); Ramkumar Subramanian, Sunnyvale, CA (US); Khoi A. Phan, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 554 days.

This patent is subject to a terminal disclaimer.

(21) Appl. No.: 10/858,605

(22) Filed: Jun. 2, 2004

(51) Int. Cl.
  *H01L 21/00* (2006.01)
(52) U.S. Cl. .................. 438/7; 438/4; 438/5; 438/12; 257/E21.525; 257/E21.527
(58) Field of Classification Search .................. 438/5, 438/7, 12, 14, 16; 257/E21.525, E21.527
  See application file for complete search history.

(56) References Cited

U.S. PATENT DOCUMENTS

| | | | |
|---|---|---|---|
| 4,707,218 A * | 11/1987 | Giammarco et al. ........ 438/421 |
| 5,141,623 A * | 8/1992 | Cohen et al. ................ 205/122 |
| 5,342,481 A * | 8/1994 | Kadomura .................... 216/46 |
| 6,703,690 B2 * | 3/2004 | Thakur et al. ............... 257/649 |
| 6,955,961 B1 * | 10/2005 | Chung ........................ 438/241 |
| 7,384,569 B1 * | 6/2008 | Dakshina-Murthy et al. .. 216/59 |
| 7,386,162 B1 * | 6/2008 | Dakshina-Murthy et al. ..... 382/144 |
| 2001/0021014 A1 * | 9/2001 | Tamada et al. ........... 356/237.2 |
| 2001/0028983 A1 * | 10/2001 | Kawamura et al. ............. 430/5 |
| 2002/0158193 A1 * | 10/2002 | Sezginer et al. ......... 250/237 G |
| 2003/0002878 A1 * | 1/2003 | Singh et al. ................. 396/611 |
| 2003/0052084 A1 * | 3/2003 | Tabery et al. ................. 216/59 |
| 2004/0018648 A1 * | 1/2004 | Lu et al. ....................... 438/14 |
| 2004/0038139 A1 * | 2/2004 | Mui et al. ..................... 430/30 |
| 2005/0227151 A1 * | 10/2005 | Hata et al. ..................... 430/5 |
| 2006/0172540 A1 * | 8/2006 | Marks et al. ................ 438/700 |
| 2006/0290012 A1 * | 12/2006 | Sadjadi ............... 257/E21.235 |
| 2007/0004217 A1 * | 1/2007 | Charatan .................... 438/736 |
| 2007/0075038 A1 * | 4/2007 | Sadjadi et al. ................ 216/67 |

* cited by examiner

*Primary Examiner*—Michelle Estrada
*Assistant Examiner*—Jarrett J Stark
(74) *Attorney, Agent, or Firm*—Amin, Turocy & Calvin, LLP

(57) ABSTRACT

The present invention relates generally to photolithographic systems and methods, and more particularly to systems and methodologies that facilitate compensating for retrograde feature profiles on an imprint mask. An aspect of the invention generates feedback information that facilitates control of imprint mask feature profile via employing a scatterometry system to detect retrograde feature profiles, and mitigating the retrograde profiles via a spacer etchback procedure.

14 Claims, 10 Drawing Sheets

FEEDBACK CONTROL OF IMPRINT MASK FEATURE PROFILE USING SCATTEROMETRY AND SPACER ETCHBACK

TECHNICAL FIELD

The present invention relates generally to photolithographic systems and methods, and more particularly to systems and methodologies that mitigate retrograde taper on imprint mask features.

BACKGROUND OF THE INVENTION

As semiconductor trends continue toward decreased size and increased packaging density, every aspect of semiconductor fabrication processes is scrutinized in an attempt to maximize efficiency in semiconductor fabrication and throughput. Many factors contribute to fabrication of a semiconductor. For example, at least one photolithographic process can be used during fabrication of a semiconductor. This particular factor in the fabrication process is highly scrutinized by the semiconductor industry in order to improve packaging density and precision in semiconductor structure.

Lithography is a process in semiconductor fabrication that generally relates to transfer of patterns between media. More specifically, lithography refers to transfer of patterns onto a thin film that has been deposited onto a substrate. The transferred patterns then act as a blueprint for desired circuit components. Typically, various patterns are transferred to a photoresist (e.g., radiation-sensitive film), which is the thin film that overlies the substrate during an imaging process described as "exposure" of the photoresist layer. During exposure, the photoresist is subjected to an illumination source (e.g. UV-light, electron beam, X-ray), which passes through a pattern template, or reticle, to print the desired pattern in the photoresist. Upon exposure to the illumination source, radiation-sensitive qualities of the photoresist permit a chemical transformation in exposed areas of the photoresist, which in turn alters the solubility of the photoresist in exposed areas relative to that of unexposed areas. When a particular solvent developer is applied, exposed areas of the photoresist are dissolved and removed, resulting in a three-dimensional pattern in the photoresist layer. This pattern is at least a portion of the semiconductor device that contributes to final function and structure of the device, or wafer.

Techniques, equipment and monitoring systems have concentrated on preventing and/or decreasing defect occurrence within lithography processes. For example, aspects of resist processes that are typically monitored can comprise: whether the correct mask has been used; whether resist film qualities are acceptable (e.g., whether resist is free from contamination, scratches, bubbles, striations, . . . ); whether image quality is adequate (e.g., good edge definition, line-width uniformity, and/or indications of bridging); whether critical dimensions are within specified tolerances; whether defect types and densities are recorded; and/or whether registration is within specified limits; etc. Such defect inspection task(s) have progressed into automated system(s) based on both automatic image processing and electrical signal processing.

Imprint lithography uses a patterned mask to "imprint" a pattern on a resist at a 1:1 feature size ratio. Thus, imprint mask integrity must be maintained throughout the lithography process because any flaw or structural defect present on a patterned imprint mask can be indelibly transferred to underlying layers during imprinting of a photoresist. One example of an undesirable structural defect is a retrograde profile on a feature on an imprint mask. Retrograde profile refers to a negative slope on a mask feature, such that the angle formed by a line running from the top of a feature and the horizontal substrate is acute, or less than 90 degrees. If such a defective imprint mask is used to imprint a wafer, a retrograde profile can inhibit a clean release of the mask from the wafer when the mask is removed, which can detrimentally affect the performance of the wafer.

Current methods of pattern line formation on an imprint mask typically can produce retrograde profiles as an undesirable side effect. As lithographic techniques are pushed to their limits, smaller and smaller CDs are desired to maximize chip performance. Thus, chip manufacture is governed largely by wafer CD, which is defined as the smallest allowable width of, or space between, lines of circuitry in a semiconductor device. As methods of wafer manufacture are improved, wafer CD is decreased, which in turn requires finer and finer line edges to be produced, which further requires finer and finer imprint mask features. As imprint mask features decrease in size, retrograde profile becomes increasingly difficult to mitigate, which ultimately can cause chip performance to deteriorate.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides for systems and methods that facilitate detection and correction of retrograde profiles on pattern lines formed on an imprint mask during mask manufacture. More specifically, the systems and methods of the invention can mitigate retrograde profiles on mask features in order to improve imprint mask performance.

According to an aspect of the invention, an imprint mask can be monitored to detect the presence of retrograde profiles on features of the imprint mask. A monitoring component, such as, for example, a scatterometry system, can provide real-time information regarding the status of features on the imprint mask. If retrograde profiles are detected, a spacer-etchback component can selectively deposit a spacer oxide on the mask and then etch the oxide layer to compensate for the retrograde profiles. A control component can make determinations regarding whether retrograde profiles are present, whether extant retrograde profiles are potentially detrimental to a wafer, whether compensatory action was successful in mitigating detected retrograde profiles, etc., based on information received from the monitoring component.

According to another aspect of the invention, inferences can be made regarding, for example, whether to initiate compensatory action to correct detected retrograde profiles. Such inferences can be based on, for example, information related to the severity of the retrograde profile, the number of retrograde feature profiles detected, the location of detected retrograde profiles, etc. For instance, a mask that has more than a predetermined threshold number of features exhibiting retrograde profiles can be scrapped in order to ensure that quality control standards are adhered to. Similarly, a retrograde profile feature that is detected in a non-critical area of an imprint mask can be ignored, thus saving costs and time associated with compensating for the retrograde profile. This aspect of the invention permits greater efficiency and economic benefit by augmenting the criteria germane to making a decision regarding compensating for potentially destructive retrograde feature profiles on an imprint mask.

To the accomplishment of the foregoing and related ends, certain illustrative aspects of the invention are described herein in connection with the following description and the annexed drawings. These aspects are indicative, however, of but a few of the various ways in which the principles of the invention can be employed and the present invention is intended to comprise all such aspects and their equivalents. Other advantages and novel features of the invention will become apparent from the following detailed description of the invention when considered in conjunction with the drawings.

DETAILED DESCRIPTION OF THE INVENTION

Figure 1:
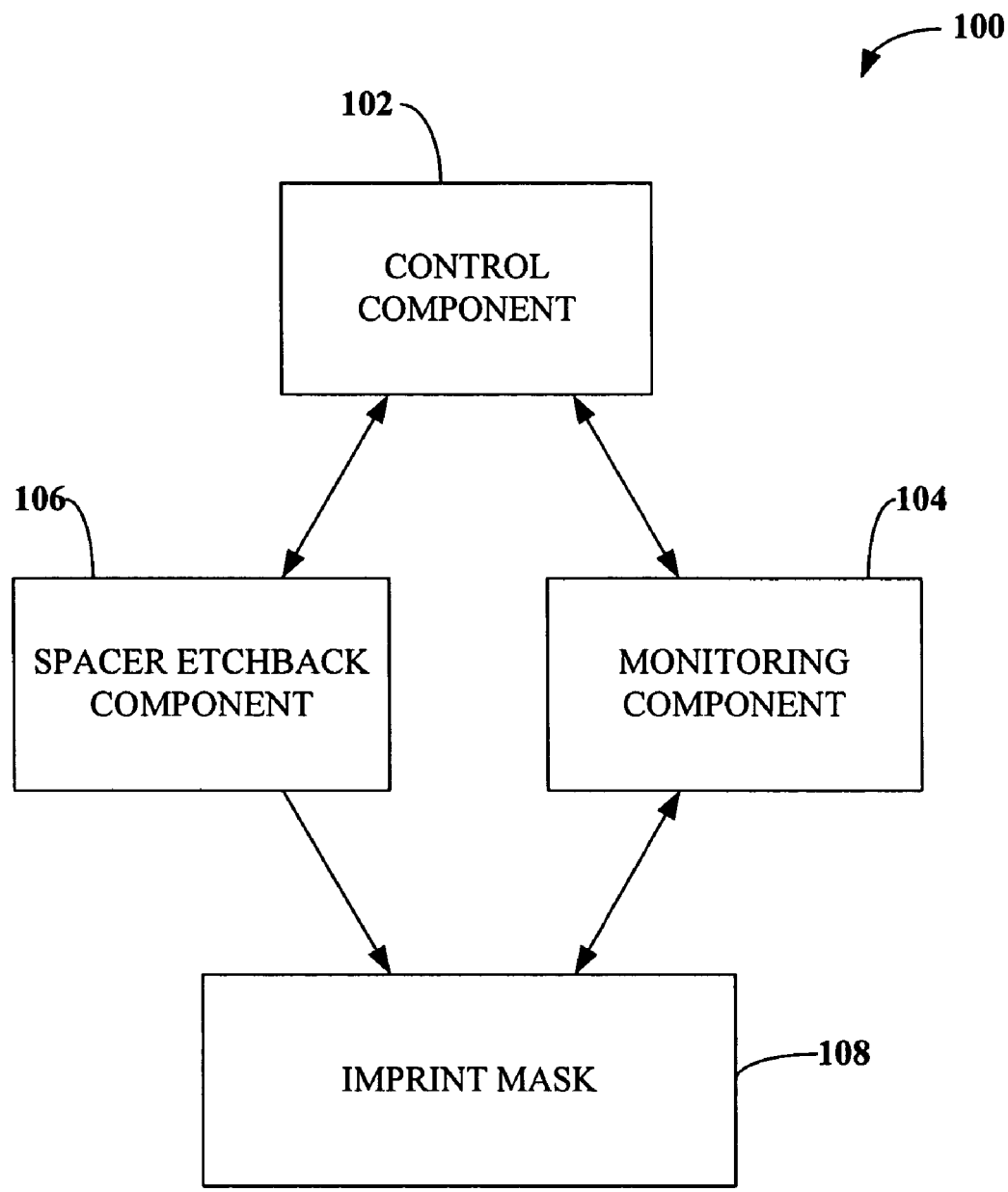
FIG. 1 is an illustration of a mask feature profile control system in accordance with an aspect of the present invention.

The present invention will now be described with reference to the drawings, wherein like reference numerals are used to refer to like elements throughout. The present invention will be described with reference to systems and methods for mitigating retrograde profiles on imprint mask features. It should be understood that the description of these exemplary aspects are merely illustrative and that they should not be taken in a limiting sense.

The term "component" refers to a computer-related entity, either hardware, a combination of hardware and software, software, or software in execution. For example, a component can be a process running on a processor, a processor, an object, an executable, a thread of execution, a program and a computer. By way of illustration, both an application running on a server and the server can be components. A component can reside in one physical location (e.g., in one computer) and/or can be distributed between two or more cooperating locations (e.g., parallel processing computer, computer network).

It is to be appreciated that various aspects of the present invention can employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks, and function link networks) can be employed.

FIG. 1 is an illustration of an imprint mask feature profile control system 100 according to an aspect of the present invention. According to the figure, a control component 102 is operatively coupled to a monitoring component 104 and to a spacer etchback component 106. Both the monitoring component 104 and the spacer etchback component 106 are operatively associated with an imprint mask 108. For example, the monitoring component 104 can monitor aspects and/or conditions associated with the imprint mask 108 during fabrication and/or prior to imprinting a wafer in order to glean information associated with potential defects on the mask. Such information can be relayed to the control component 102 for analysis. If information gathered by the monitoring component 104 is indicative of a mask defect, the control component 102 can initiate compensatory action to mitigate the detrimental effect of such a defect on a wafer during imprinting of the wafer. To further this example, if the monitoring component detects a condition indicative of a retrograde profile on a feature of the imprint mask 108, then the control component 102 can signal the spacer etchback component 106 to selectively deposit a layer of, for example, silicon dioxide ($SiO_2$), over the feature exhibiting the retrograde profile. The spacer etchback component 106 can then selectively etch the $SiO_2$ from the mask in a manner that permits $SiO_2$ to remain in the gap formed by the retrograde profile, such that the slope of the remaining $SiO_2$ from the top of the feature to the bottom of the feature is a positive slope, as desired.

The invention is not limited to SiO2 in performing the spacer etchback protocol describe above, but rather can employ any suitable material. For example, if the mask is formed of a quartz substrate, than any suitable material whose properties are compatible with quartz can be employed by the present invention. Similarly, the invention can be employed to compensate for retrograde profiles on a chrome mask.

It is to be appreciated that the monitoring component 104 can be, for example, a scatterometry component. An advantage associated with employing a scatterometry system to monitor an imprint mask is that retrograde profiles on mask features can be detected without requiring cross-sectioning of the mask. The present invention contemplates any suitable scatterometry component and/or system, and such systems are intended to fall within the scope of the hereto-appended claims. It is further to be appreciated that the monitoring component 104 utilized by the present invention can be, for example, a Scanning Electron Microscope (SEM), a Critical Dimension Scanning Electron Microscope (CD-SEM), a Field Effect Scanning Electron Microscope (FESEM), an In-Lens FESEM, or a Semi-In-Lens FESEM, depending on the desired magnification and precision. For example, FESEM permits greater levels of magnification and resolution at high or low energy levels by rastering a narrower electron beam over the sample area. FESEM thus permits quality resolution at approximately 1.5 nm. Because FESEM can produce high-quality images at a wide range of accelerating voltages (typically 0.5 kV to 30 kV), it is able to do so without inducing extensive electrical charge in the sample. Furthermore, conventional SEM cannot accurately image an insulating material unless the material is first coated with an electrically conductive material. FESEM mitigates the need to deposit an electrically conductive coating prior to scanning. According to another example, the monitoring component 104 of the present invention can be In-Lens FESEM, which is capable of 0.5 nm resolution at an accelerating voltage of 30 kV, or any other suitable type of scanner, such as Transmission Electron Microscopy (TEM), Atomic Force Microscopy (AFM), Scanning Probe Microscopy (SPM), etc.

It is further to be appreciated that information gathered by the monitoring component 104 can be utilized for generating feedback and/or feed-forward data that can facilitate compensating for detected retrograde profiles on imprint mask features. The mask feature profile control system 100 can additionally employ such data to control components and/or operating parameters associated therewith. For instance, feedback/feed-forward information can be generated from sequence analysis to maintain, increase and/or decrease a rate at which etchback processes progress. Additionally, one or a plurality of sensors can be associated with the mask feature profile control system 100 to permit data to be gathered regarding the state of the mask (e.g., temperature, density, viscosity, material composition, solubility, and/or any other suitable information related to the condition of the mask).

Figure 2:
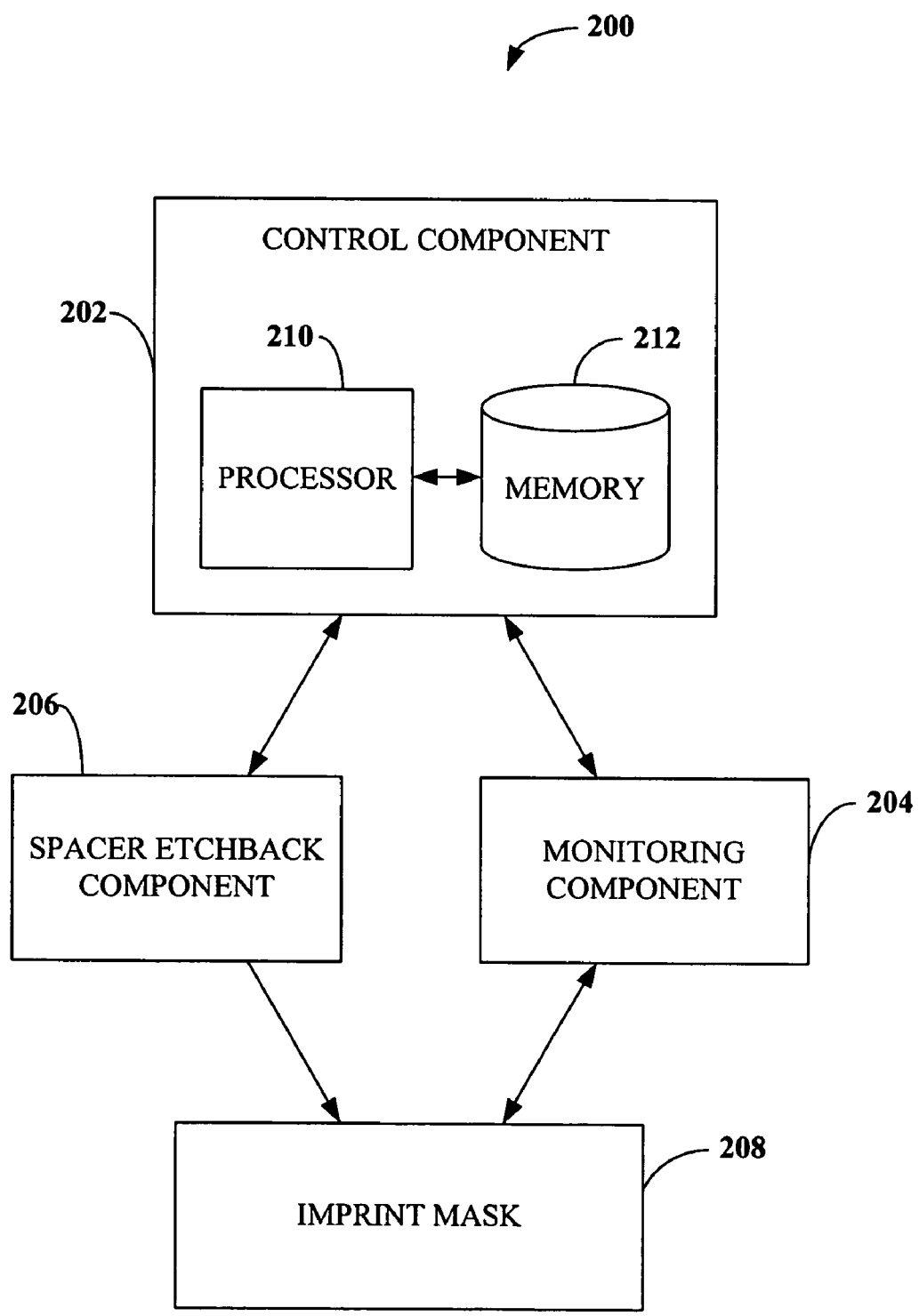
FIG. 2 is an illustration of a mask feature profile control system in accordance with an aspect of the present invention comprising a processor and a memory.

FIG. 2 illustrates a mask feature profile control system 200 in accordance with an aspect of the present invention. The mask feature profile control system 200 comprises a control component 202 that is operatively coupled to each of a monitoring component 204 and a spacer etchback component 206. The monitoring component 204 gathers information regarding the status of an imprint mask 208 before the mask is employed to imprint a wafer. The control component 202 can receive such status information from the monitoring component 204 to determine whether compensatory action is required to compensate for extant retrograde profiles on mask features. The control component 202 is operatively associated with a processor 210 and a memory 212, both of which are operably coupled to each other. It is to be understood that the processor 210 can be a processor dedicated to determining whether retrograde profiles exist on mask features, a processor used to control one or more of the components of the present system(s), or, alternatively, a processor that is used to determine whether retrograde profiles exist and to control one or more of the components of the mask feature profile control system.

The memory component 212 can be employed to retain control programs, semiconductor fabrication data, etc. Furthermore, the memory 212 can be either volatile memory or nonvolatile memory, or can comprise both volatile and nonvolatile memory. By way of illustration, and not limitation, nonvolatile memory can comprise read only memory (ROM), programmable ROM (PROM), electrically programmable ROM (EPROM), electrically erasable ROM (EEPROM), or flash memory. Volatile memory can comprise random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ES-DRAM), Synchlink DRAM (SLDRAM), and direct Rambus RAM (DRRAM). The memory 212 of the present systems and methods is intended to comprise, without being limited to, these and any other suitable types of memory.

Figure 3:
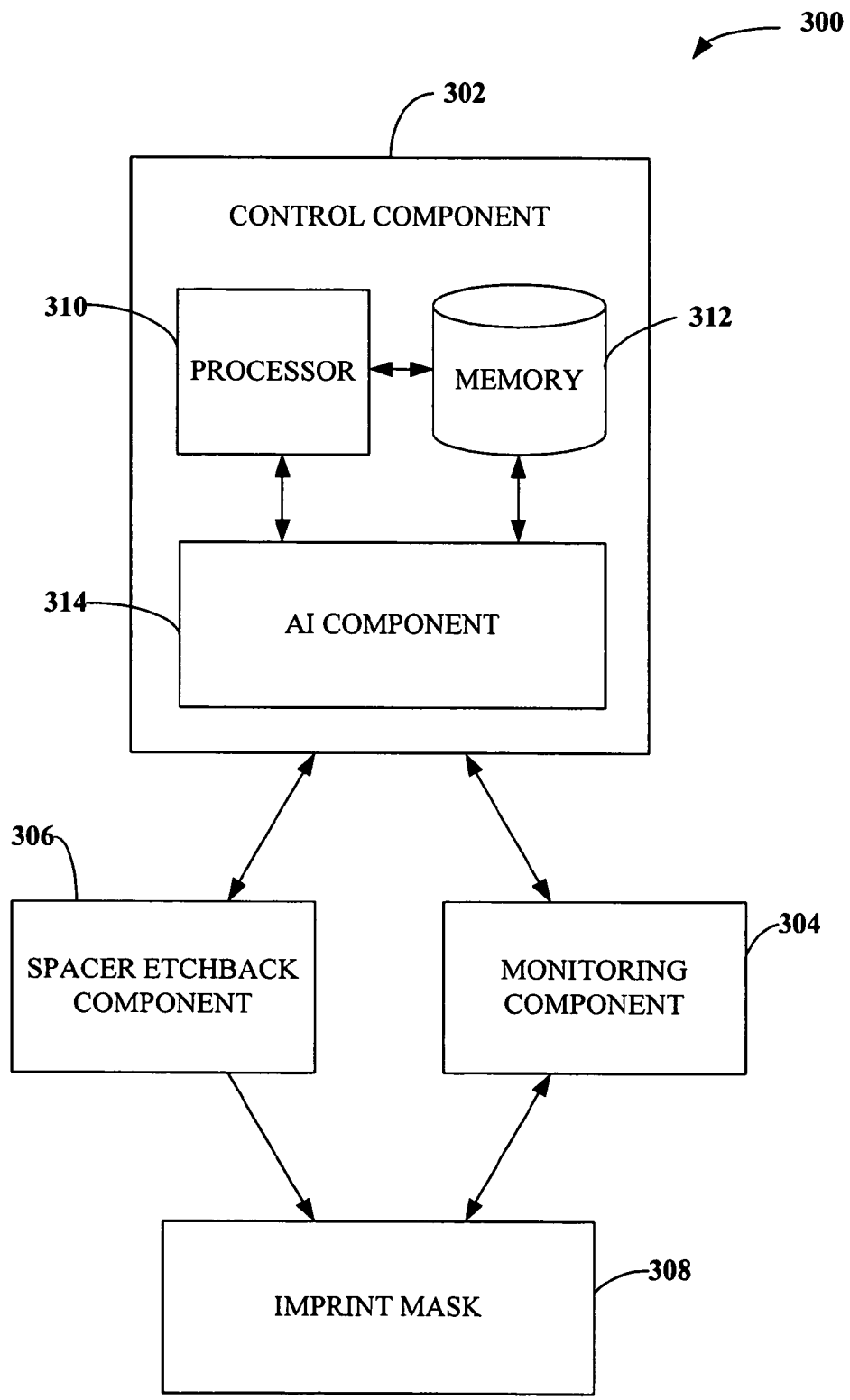
FIG. 3 is an illustration of a mask feature profile control system in accordance with the present invention wherein a processor comprises an artificial intelligence component.

FIG. 3 is an illustration of a mask feature profile control system 300 in accordance with an aspect of the present invention. The mask feature profile control system 300 can employ various inference schemes and/or techniques in connection with mitigating retrograde feature profiles. As used herein, the term "inference" refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the subject invention.

Still referring to FIG. 3, the mask feature profile control system 300 comprises a control component 302 that is operatively coupled to each of a monitoring component 304 and a spacer etchback component 306. The monitoring component monitors the status of an imprint mask 308 and transmits data associated therewith to the control component 302. The control component 302 comprises a processor 310 that can analyze data received from the monitoring component 304, and a memory component 312 that can store information related to various aspects of the imprint mask. The control component 302 also comprises an artificial intelligence (AI) component 314 that can make inferences regarding system operation, such as whether and/or to what extent compensatory action should be taken to mitigate the potential deleterious effects of a defect on an imprint mask, such as a retrograde profile on a mask feature. For example, the AI component 314 can determine an optimal duration for employing the spacer etchback component 308, an optimal amount of $SiO_2$ to be deposited on a mask exhibiting retrograde profiles, etc. According to another example, the AI component 314 can make inferences regarding whether a detected retrograde profile will adversely affect a wafer based on, for instance, location, degree of retrograde slope, etc. These examples are given by way of illustration only and are not in any way intended to limit the scope of the present invention or the number of, or manner in which the AI component makes, inferences.

Figure 4:
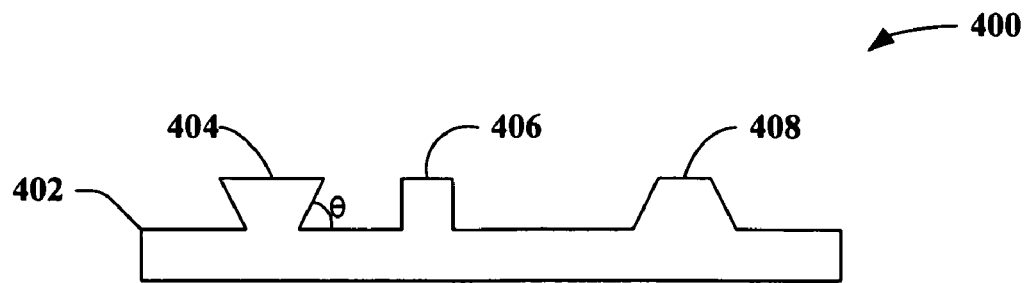
FIG. 4 is a cross-sectional illustration of an imprint mask substrate with having a retrograde feature profile.

FIG. 4 is a cross-sectional view 400 of an imprint mask having features 404, 406, and 408 that exhibit various profiles. Feature 404 is an example of a retrograde profile having a negative slope so that upon removal from an imprinted wafer, the shape of the feature will cause mask material, and possibly wafer material, to be torn loose. As defined herein, a retrograde feature profile is a feature profile that exhibits a negative slope, such that the angle between the horizontal surface of the mask and the side of the feature is acute, or less than 90 degrees. Such an angle is illustrated as theta on feature 404 of FIG. 4. Typically, an acute angle of less than 88 degrees requires compensatory action. While a theta of between 88 and 90 degrees can have detrimental effects on a wafer when the imprint mask is withdrawn there from, such a minimal retrograde profile does not necessarily require compensatory measures. Similarly, a theta of between 90 and 92 degrees can be adequate for a clean release of the imprint mask from the wafer. Feature 406 exhibits a more desirable profile, such that the slope of the feature profile is infinite, or vertical, which will typically permit a clean release of the imprint mask from the wafer after imprinting. Feature 408 is an example of a desirable feature profile, wherein the slope of the profile is positive, and preferably has a theta that is greater than 92 degrees. This positive slope will consistently facilitate a clean release of the imprint mask from a wafer after imprinting. The present invention is capable of determining whether a particular retrograde profile is within predefined profile tolerances in order to facilitate a determination of whether the potential for damage to the wafer upon removal of the imprint mask is sufficiently high to warrant taking corrective action.

Figure 5:
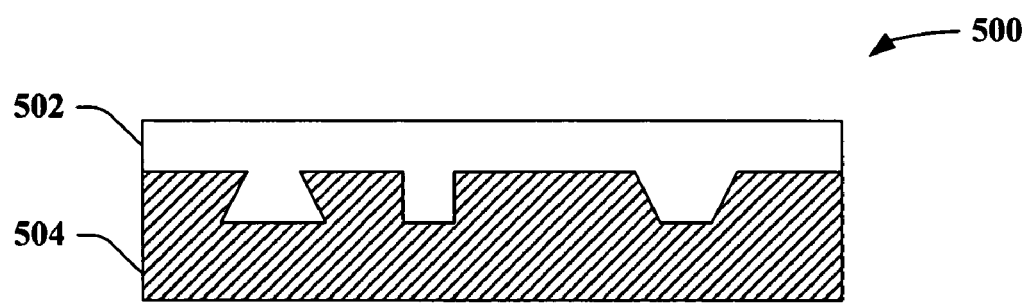
FIG. 5 illustrates a cross-sectional view of a mask with pattern lines exhibiting retrograde profile while imprinting a wafer.

FIG. 5 illustrates a cross-sectional view 500 of an imprint mask 502 during imprinting of a wafer 504. Typical imprint techniques are begun by depositing a liquid polymer on a wafer substrate. An imprint mask is pressed into the liquid, such as is illustrated in FIG. 5. While the mask is pressed into the liquid, the wafer and mask are exposed to an illumination source, causing a change in the solubility of the wafer polymer. Finally, the imprint mask is removed from the hardened liquid polymer, which remains on the wafer substrate. However, if the imprint mask exhibits a retrograde profile on any of its features, damage can be caused to the hardened wafer polymer.

Figure 6:
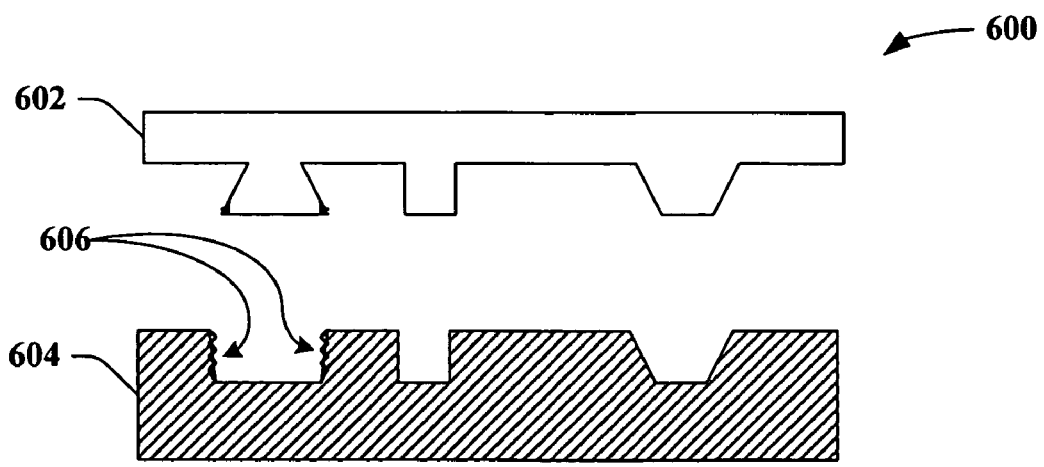
FIG. 6 illustrates cross-sectional view of an imprint mask having a retrograde feature profile and an imprinted wafer after the imprint mask has damaged the wafer during mask removal.

FIG. 6 is a cross-sectional illustration 600 of an imprint mask 602 after removal from a wafer 604. As illustrated, damage has occurred to sidewalls 606 on the hardened wafer polymer due to the retrograde profile of feature 404 (see FIG. 4) during removal of the imprint mask. Such damage can be mitigated by the systems and methods described herein.

Figure 7:
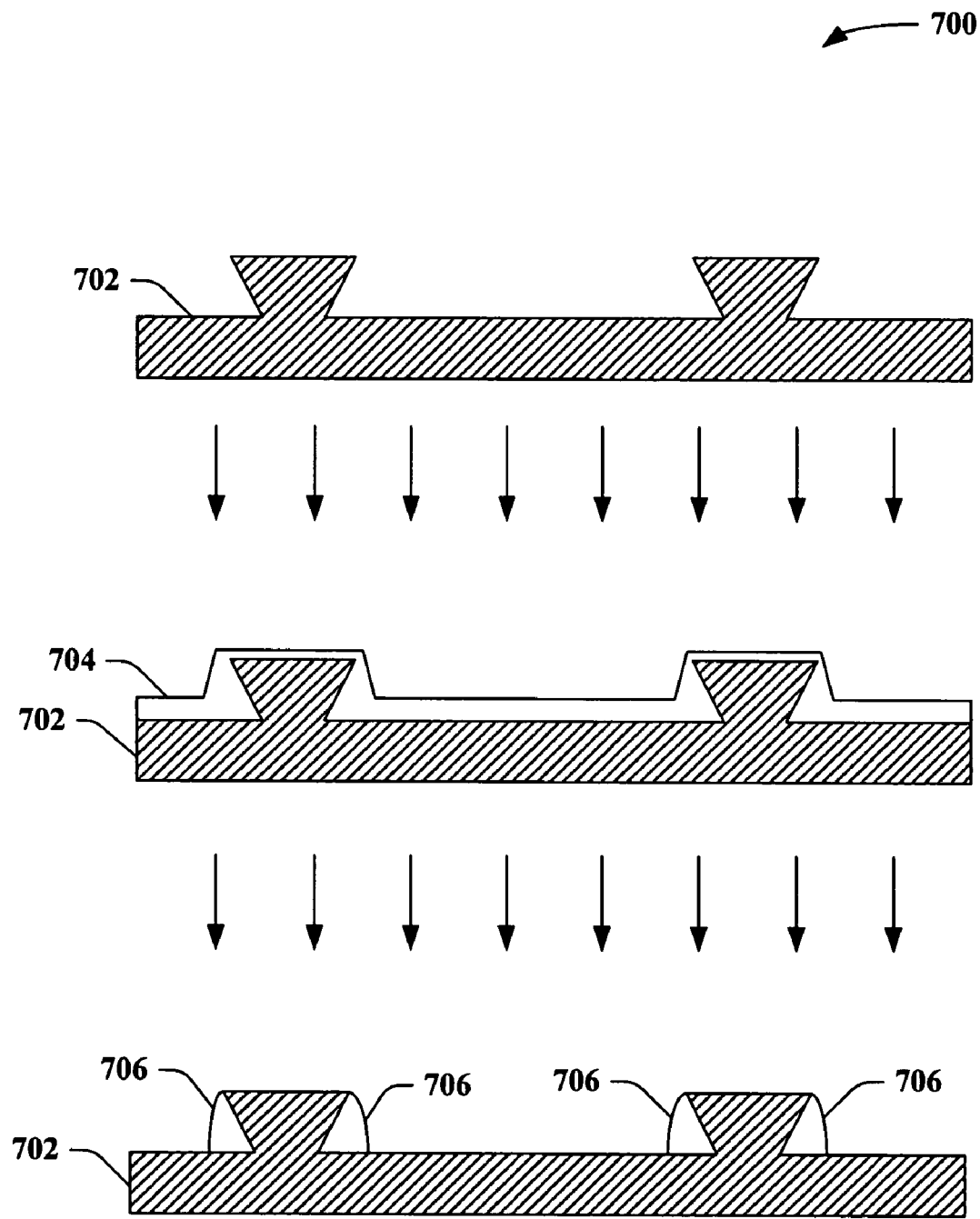
FIG. 7 illustrates cross-sectional view of an imprint mask having retrograde feature profiles undergoing a spacer etchback procedure to compensate for the retrograde profiles.

FIG. 7 illustrates a cross-section 700 of a portion of an imprint mask 702 exhibiting retrograde feature profiles, which, as discussed above, can be detrimental to the structure of a wafer imprinted thereby. A spacer oxide 704 is deposited on the mask 702, illustrated by a set of inverted arrows. The spacer oxide 704 occupies the space created by the negative slope of the retrograde profile and coats the surface of the mask 702. A spacer etch can be performed on the oxide layer 704, as indicated by the second set of inverted arrows, such that the spacer oxide 704 is etched away from the horizontal surfaces of the mask 702. A slight positive taper 706 is achieved as a result of spacer oxide remnants, retained in the gaps formed by the retrograde profile of the mask features. Spacer etch is typically carried out using a Reactive Ion Etch (RIE) process, wherein directional ion bombardment enables the removal of deposited material in an anisotropic manner, thereby mitigating the original re-entrant profile of the imprint mask. The degree of anisotropy in the spacer formation process (e.g., lateral etch rate/vertical etch rate, etc.) can be appropriately adjusted as required utilizing techniques well known to those familiar in the art. Such positive taper 706 mitigates the detrimental effect that a retrograde profile can have on a mask and/or a wafer during removal after imprinting by the mask.

It is to be appreciated that correctly formed features (e.g., features that do not exhibit a retrograde profile, etc.) can also have spacer formation(s) that can be controllable via anisotropic adjustment(s) to the etch process. The etch process can result in mask dimensions being slightly altered depending on the amount of correction required to mitigate extant retrograde profiles. If retrograde correction is required with relatively high frequency, then the original mask CD can be appropriately adjusted to compensate for anticipated CD variation during execution of the spacer technique. In this manner, CDs of initially correct features can be retained at precise target values despite variances effected by spacer etchback.

Additionally, because an imprint mask is essentially a negative of a desired resist pattern (e.g., desired "lines" on the resist are achieved via imprinting with a mask that has corresponding "spaces," etc.), the spacer formation also can provide for fine-tuned corrections of mask CD for size-critical applications, such as, for example, gate layers for MOSFETS, etc. Such CD correction can be facilitated regardless of whether retrograde profile(s) are present. In such a scenario, an imprint mask can be fabricated via conventional methods, and a final correction of, for example, a few nanometers, can be performed via a spacer formation technique.

Figure 8:
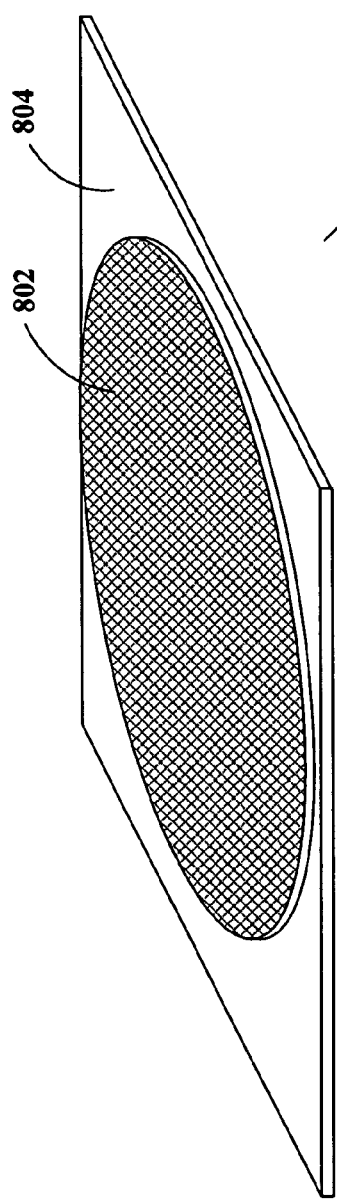
FIG. 8 illustrates a perspective view of a grid-mapped mask according to one or more aspects of the present invention.
Figure 9:
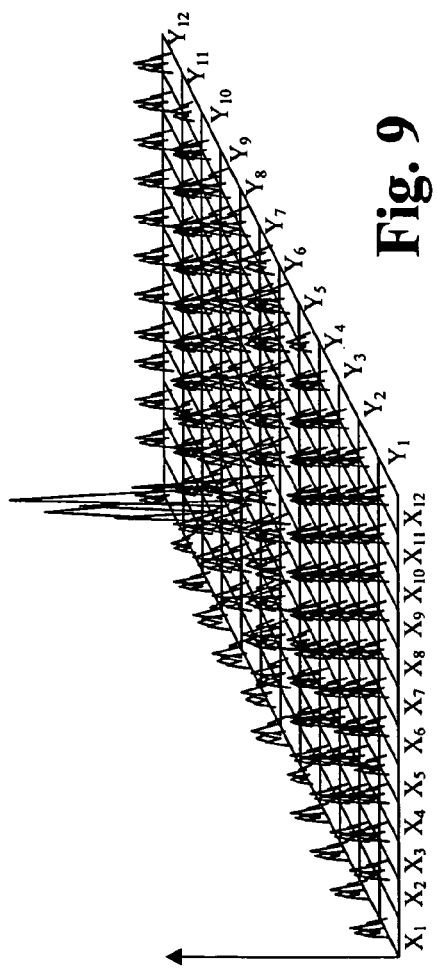
FIG. 9 illustrates plots of measurements taken at grid-mapped locations on a mask in accordance with one or more aspects of the present invention.
Figure 10:
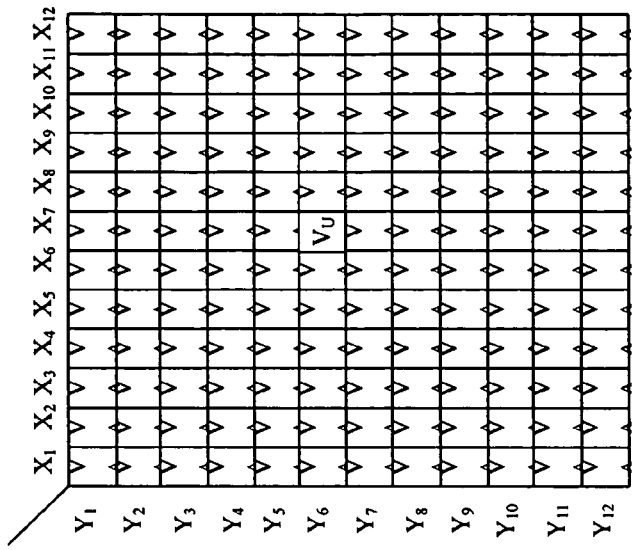
FIG. 10 illustrates a table containing entries corresponding to measurements taken at respective grid-mapped locations on a mask in accordance with one or more aspects of the present invention.

Turning now to FIGS. 8-10, in accordance with one or more aspects of the present invention, a mask 802 (or one or more die located thereon) situated on a stage 804 can be logically partitioned into grid blocks to facilitate concurrent measurements of critical dimensions and overlay as the mask matriculates through a semiconductor fabrication process. This can facilitate selectively determining to what extent, if any, fabrication adjustments are necessary. Obtaining such information can also assist in determining problem areas associated with fabrication processes.

FIG. 8 illustrates a perspective view of the steppable stage 804 supporting the mask 802. The mask 802 can be divided into a grid pattern as shown in FIG. 8. Each grid block (XY) of the grid pattern corresponds to a particular portion of the mask 802 (e.g., a die or a portion of a die). The grid blocks are individually monitored for fabrication progress by concurrently measuring critical dimensions and overlay with either scatterometry or scanning electron microscope (SEM) techniques.

This can also be applicable in order to assess mask-to-mask and lot-to-lot variations. For example, a portion P (not shown) of a first mask (not shown) can be compared to the corresponding portion P (not shown) of a second mask. Thus, deviations between masks and lots can be determined in order to calculate adjustments to the fabrication components that are necessary to accommodate for the mask-to-mask and/or lot-to-lot variations.

In FIG. 9, one or more respective portions of the mask 802 ($X_1Y_1 \ldots X_{12}, Y_{12}$) are concurrently monitored for critical dimensions and overlay utilizing either scatterometry or scanning electron microscope techniques. Exemplary measurements produced during fabrication for each grid block are illustrated as respective plots. The plots can, for example, be composite valuations of signatures of critical dimensions and overlay. Alternatively, critical dimensions and overlay values can be compared separately to their respective tolerance limits.

As can be seen, the measurement at coordinate $X_7Y_6$ yields a plot that is substantially higher than the measurement of the other portions XY. This can be indicative of overlay, overlay error, and/or one or more critical dimension(s) outside of acceptable tolerances. As such, fabrication components and/or operating parameters associated therewith can be adjusted accordingly to mitigate repetition of this aberrational measurement. It is to be appreciated that the mask 802 and or one or more die located thereon can be mapped into any suitable number and/or arrangement of grid blocks to effectuate desired monitoring and control.

FIG. 10 is a representative table of concurrently measured critical dimensions and overlay taken at various portions of the mask 802 mapped to respective grid blocks. The measurements in the table can, for example, be amalgams of respective critical dimension and overlay signatures. As can be seen, all the grid blocks, except grid block $X_7Y_6$, have measurement values corresponding to an acceptable value ($V_A$) (e.g., no overlay error is indicated and/or overlay measurements and critical dimensions are within acceptable tolerances), while grid block $X_7Y_6$ has an undesired value ($V_U$) (e.g., overlay and critical dimensions are not within acceptable tolerances, thus at least an overlay or CD error exists). Thus, it has been determined that an undesirable fabrication condition exists at the portion of the mask 802 mapped by grid block $X_7Y_6$. Accordingly, fabrication process components and parameters can be adjusted as described herein to adapt the fabrication process accordingly to mitigate the re-occurrence or exaggeration of this unacceptable condition.

Alternatively, a sufficient number of grid blocks can have desirable thickness measurements so that the single offensive grid block does not warrant scrapping the entire mask. It is to be appreciated that fabrication process parameters can be adapted so as to maintain, increase, decrease and/or qualitatively change the fabrication of the respective portions of the mask 802 as desired. For example, when the fabrication process has reached a pre-determined threshold level (e.g., X % of grid blocks have acceptable CDs and no overlay error exists), a fabrication step can be terminated.

Figure 11:
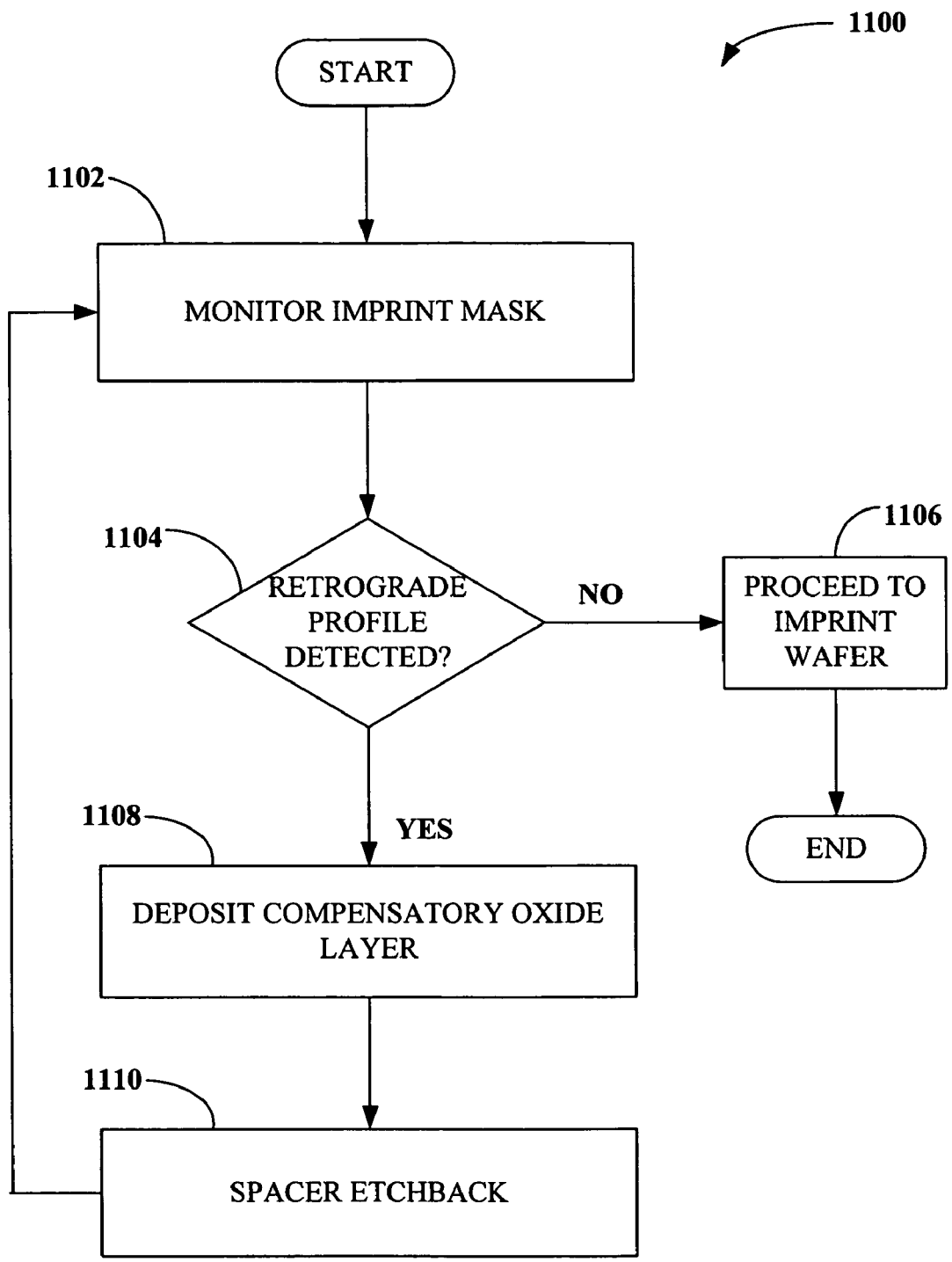
FIG. 11 is an illustration of a flow diagram of a methodology in accordance with an aspect of the present invention.
Figure 12:
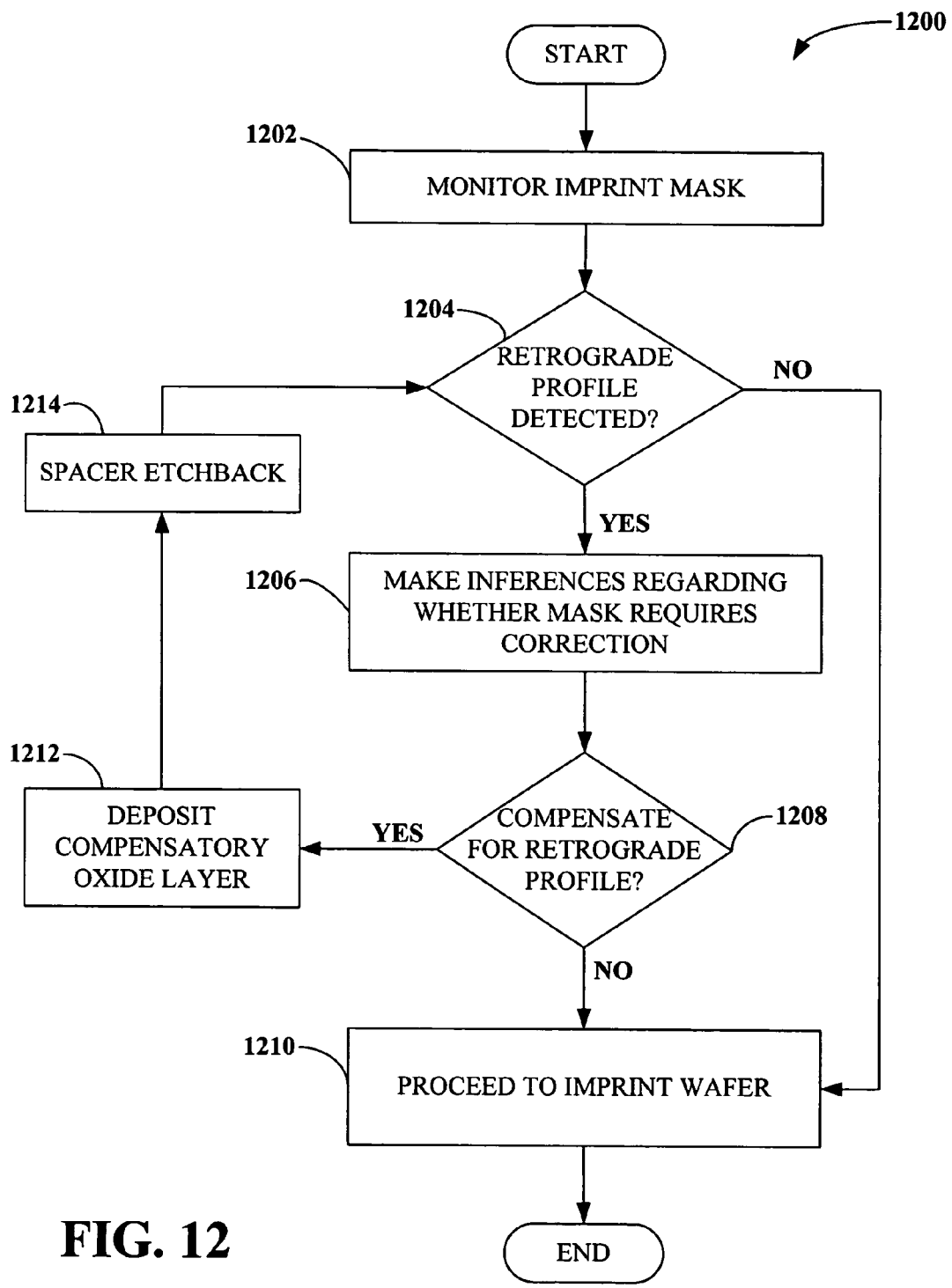
FIG. 12 is an illustration of a flow diagram of a methodology in accordance with an aspect of the present invention.

Now turning to FIGS. 11 and 12, methodologies that can be implemented in accordance with the present invention are illustrated. While, for purposes of simplicity of explanation, the methodologies are shown and described as a series of blocks, it is to be understood and appreciated that the present invention is not limited by the order of the blocks, as some blocks can, in accordance with the present invention, occur in different orders and/or concurrently with other blocks from that shown and described herein. Moreover, not all illustrated blocks may be required to implement the methodologies in accordance with the present invention.

FIG. 11 is an illustration of a methodology 1100 in accordance with an aspect of the present invention. At 1102, an imprint mask is monitored via, for example, a scatterometry system. Scatterometry offers several advantages over other monitoring methods, including but not limited to, an ability to detect retrograde profiles without requiring a cross-sectional image of an imprint mask. At 1104, a determination is made regarding the presence of retrograde profile(s) on feature(s) on the imprint mask. If it is determined at 1104 that no retrograde profiles are present, then the methodology can proceed to 1106, where imprinting of a wafer can be approved. If retrograde profiles are detected at 1104, the methodology can proceed to 1108, where a compensatory oxide layer can be deposited on the imprint mask. Silicon dioxide (SiO2) is an exemplary material for a compensatory deposit layer as it is not affected by exposure during imprinting. However, any suitable material having properties consistent with those of the mask substrate (e.g., quartz, fused-silica, $SiX_Y$ (where X is an element such as nitrogen, oxygen, etc., and Y is positive integer), etc.) can be utilized, and the present invention contemplates any and all such materials.

At 1110, a spacer etchback procedure is performed on the deposited compensatory layer, such that material is removed from the horizontal and positively-sloped surfaces of the imprint mask, while deposited compensatory material is retained in areas created by the retrograde profiles (e.g., negatively-sloped areas). The methodology can then revert to 1102 for further monitoring and retrograde profile detection to ensure that the compensatory measures were successful.

FIG. 12 is an illustration of a methodology 1200 in accordance with an aspect of the present invention. An imprint mask is monitored via, for example, a scatterometry system, at 1202. At 1204, a determination is made as to whether retrograde profiles are present on features on the imprint mask. If no retrograde profiles are detected on the imprint mask at 1204, then imprint mask can be safely employed to imprint a wafer at 1210. If retrograde profiles are detected at 1204, then inferences can be made regarding whether to take corrective action at 1206. At 1208, a determination is made regarding whether to initiate compensatory action for the retrograde profiles, based at least in part on inferences made at 1206. For example, a retrograde profile may be detected in a region of the mask that will not adversely affect a wafer imprinted by the defective mask. Inferences regarding, for example, the location of the retrograde profile, severity of the negative slope of the retrograde profile, etc., can be utilized to determine whether the compensatory action is necessary. If it is determined that the particular detected retrograde profile will not be detrimental to the wafer upon imprinting, then the imprint mask can be employed to imprint a wafer at 1210, thus saving any costs associated with compensating for the retrograde profile. If it is determined that the retrograde profile requires compensatory action, then the methodology can proceed to 1212, where a compensatory material can be deposited over the mask. The compensatory material can be, for example, silicon dioxide ($SiO_2$) Such material can then undergo a spacer etchback at 1214. Once the spacer etchback is complete, the system can revert to 1202 for further monitoring in order to verify that the compensatory action was successful. If so, then at 1204, no retrograde profile will be detected and the imprint mask can be approved for use.

Figure 13:
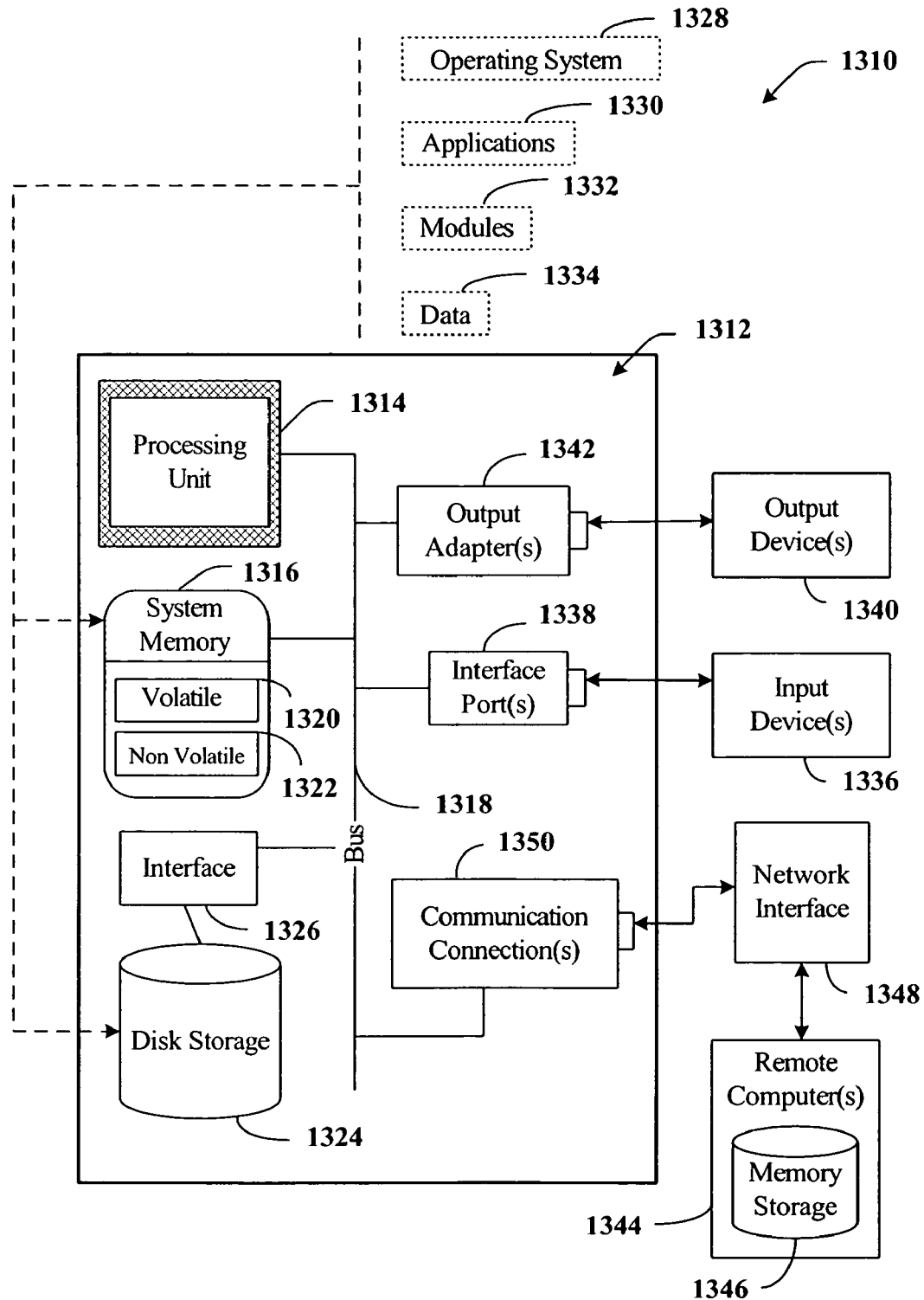
FIGS. 13 and 14 are illustrations of exemplary computing systems and/or environments in connection with facilitating employment of the subject invention.
Figure 14:
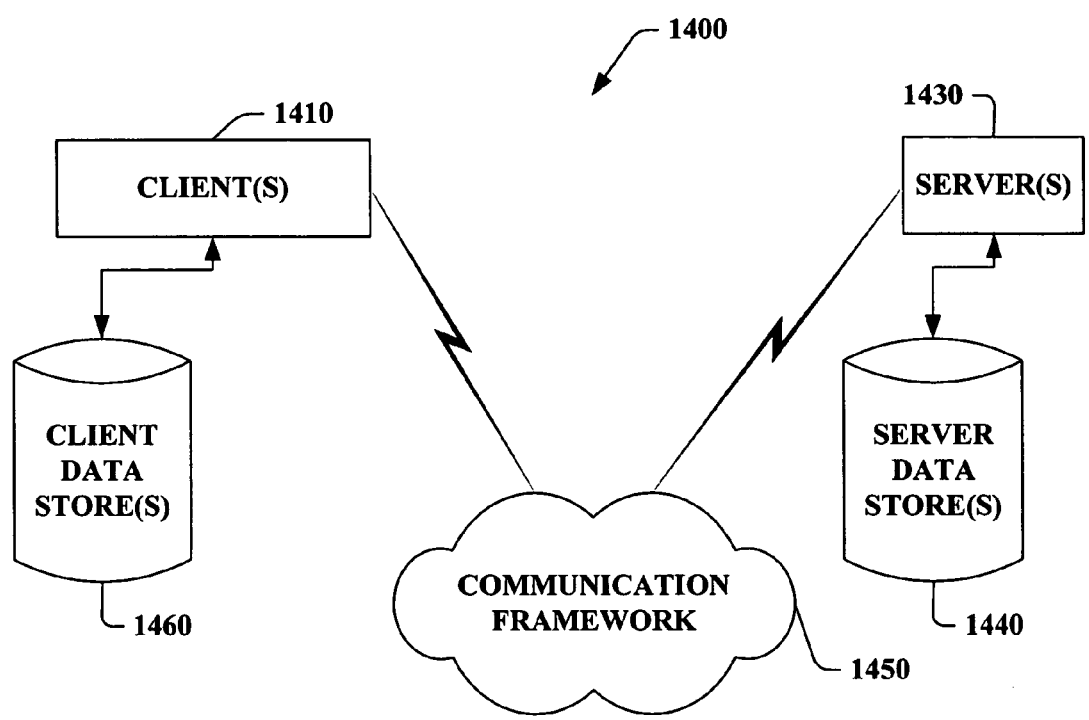

In order to provide a context for the various aspects of the invention, FIGS. 13 and 14 as well as the following discussion are intended to provide a brief, general description of a suitable computing environment in which the various aspects of the present invention can be implemented. While the invention has been described above in the general context of computer-executable instructions of a computer program that runs on a computer and/or computers, those skilled in the art will recognize that the invention also can be implemented in combination with other program modules. Generally, program modules include routines, programs, components, data structures, etc. that perform particular tasks and/or implement particular abstract data types. Moreover, those skilled in the art will appreciate that the inventive methods can be practiced with other computer system configurations, including single-processor or multiprocessor computer systems, mini-computing devices, mainframe computers, as well as personal computers, hand-held computing devices, microprocessor-based or programmable consumer electronics, and the like. The illustrated aspects of the invention can also be practiced in distributed computing environments where tasks are performed by remote processing devices that are linked through a communications network. However, some, if not all, aspects of the invention can be practiced on stand-alone computers. In a distributed computing environment, program modules can be located in both local and remote memory storage devices.

With reference to FIG. 13, an exemplary environment 1310 for implementing various aspects of the invention includes a computer 1312. The computer 1312 includes a processing unit 1314, a system memory 1316, and a system bus 1318. The system bus 1318 couples system components including, but not limited to, the system memory 1316 to the processing unit 1314. The processing unit 1314 can be any of various available processors. Dual microprocessors and other multiprocessor architectures also can be employed as the processing unit 1314.

The system bus 1318 can be any of several types of bus structure(s) including the memory bus or memory controller, a peripheral bus or external bus, and/or a local bus utilizing any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1316 includes volatile memory 1320 and nonvolatile memory 1322. The basic input/output system (BIOS), comprising the basic routines to transfer information between elements within the computer 1312, such as during start-up, is stored in nonvolatile memory 1322. By way of illustration, and not limitation, nonvolatile memory 1322 can include read only memory (ROM), programmable ROM (PROM), electrically programmable ROM (EPROM), electrically erasable ROM (EEPROM), or flash memory. Volatile memory 1320 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1312 also includes removable/non-removable, volatile/non-volatile computer storage media. FIG. 13 illustrates, for example a disk storage 1324. Disk storage 1324 includes, but is not limited to, devices like a magnetic disk drive, floppy disk drive, tape drive, Jaz drive, Zip drive, LS-100 drive, flash memory card, or memory stick. In addition, disk storage 1324 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1324 to the system bus 1318, a removable or non-removable interface is typically used such as interface 1326.

It is to be appreciated that FIG. 13 describes software that acts as an intermediary between users and the basic computer resources described in suitable operating environment 1310. Such software includes an operating system 1328. Operating system 1328, which can be stored on disk storage 1324, acts to control and allocate resources of the computer system 1312. System applications 1330 take advantage of the management of resources by operating system 1328 through program modules 1332 and program data 1334 stored either in system memory 1316 or on disk storage 1324. It is to be appreciated that the present invention can be implemented with various operating systems or combinations of operating systems.

A user enters commands or information into the computer 1312 through input device(s) 1336. Input devices 1336 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1314 through the system bus 1318 via interface port(s) 1338. Interface port(s) 1338 include, for example, a serial port, a parallel port, a game port, and a universal serial bus (USB). Output device(s) 1340 use some of the same type of ports as input device(s) 1336. Thus, for example, a USB port can be used to provide input to computer 1312, and to output information from computer 1312 to an output device 1340. Output adapter 1342 is provided to illustrate that there are some output devices 1340 like monitors, speakers, and printers, among other output devices 1340, which require special adapters. The output adapters 1342 include, by way of illustration and not limitation, video and sound cards that provide a means of connection between the output device 1340 and the system bus 1318. It should be noted that other devices and/or systems of devices provide both input and output capabilities such as remote computer(s) 1344.

Computer 1312 can operate in a networked environment utilizing logical connections to one or more remote computers, such as remote computer(s) 1344. The remote computer(s) 1344 can be a personal computer, a server, a router, a network PC, a workstation, a microprocessor based appliance, a peer device or other common network node and the like, and typically includes many or all of the elements described relative to computer 1312. For purposes of brevity, only a memory storage device 1346 is illustrated with remote computer(s) 1344. Remote computer(s) 1344 is logically connected to computer 1312 through a network interface 1348 and then physically connected via communication connection 1350. Network interface 1348 encompasses communication networks such as local-area networks (LAN) and wide-area networks (WAN). LAN technologies include Fiber Distributed Data Interface (FDDI), Copper Distributed Data Interface (CDDI), Ethernet/IEEE 1102.3, Token Ring/IEEE 1102.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1350 refers to the hardware/software employed to connect the network interface 1348 to the bus 1318. While communication connection 1350 is shown for illustrative clarity inside computer 1312, it can also be external to computer 1312. The hardware/software necessary for connection to the network interface 1348 includes, for exemplary purposes only, internal and external technologies such as, modems including regular telephone grade modems, cable modems and DSL modems, ISDN adapters, and Ethernet cards.

FIG. 14 is a schematic block diagram of a sample-computing environment 1400 with which the present invention can interact. The system 1400 includes one or more client(s) 1410. The client(s) 1410 can be hardware and/or software (e.g., threads, processes, computing devices). The system 1400 also includes one or more server(s) 1430. The server(s) 1430 can also be hardware and/or software (e.g., threads, processes, computing devices). The servers 1430 can house threads to perform transformations by employing the present invention, for example. One possible communication between a client 1410 and a server 1430 can be in the form of a data packet adapted to be transmitted between two or more computer processes. The system 1400 includes a communication framework 1450 that can be employed to facilitate communications between the client(s) 1410 and the server(s) 1430. The client(s) 1410 are operably connected to one or more client data store(s) 1460 that can be employed to store information local to the client(s) 1410. Similarly, the server(s) 1430 are operably connected to one or more server data store(s) 1440 that can be employed to store information local to the servers 1430.

What has been described above comprises examples of the present invention. It is, of course, not possible to describe every conceivable combination of components or methodologies for purposes of describing the present invention, but one of ordinary skill in the art can recognize that many further combinations and permutations of the present invention are possible. Accordingly, the present invention is intended to embrace all such alterations, modifications and variations that fall within the spirit and scope of the appended claims. Furthermore, to the extent that the term "comprises" is used in either the detailed description or the claims, such term is intended to be inclusive in a manner similar to the term "comprising" as "comprising" is interpreted when employed as a transitional word in a claim.

What is claimed is:

1. A method for providing feedback control of imprint mask feature profile, comprising:
    monitoring an imprint mask;
    detecting at least one retrograde profile having a negative slope on mask features wherein an angle between a horizontal surface of the mask and an outerside of at least one of the mask features is acute; and
    altering the imprint mask to compensate for the at least one retrograde profile such that wafer material is mitigated from being torn loose upon removal of the imprint mask from a wafer being imprinted therewith.

2. The method of claim 1, altering the imprint mask further comprises depositing a spacer oxide layer on the mask if at least one retrograde feature profile is detected.

3. The method of claim 2, further comprising selectively etching the spacer oxide from the imprint mask to mitigate the at least one retrograde profile.

4. The method of claim 1, the monitoring component employs a scatterometry system to detect the at least one retrograde profile on mask features.

5. The method of claim 1, further comprising initiating compensatory measures for the at least one retrograde profile based at least on information regarding mask feature status.

6. The method of claim 1, further comprising generating feedback for controlling at least one parameter associated with at least one of monitoring the imprint mask and compensating for the at least one retrograde profile.

7. The method of claim 1, further comprising grid-mapping the imprint mask to a plurality of sections.

8. The method of claim 7, further comprising creating a library of grid-map sections that are non-critical to facilitate a decision regarding initiating compensatory action to mitigate the at least one retrograde profile.

9. A method for providing feedback control of imprint mask feature profile, comprising:
    monitoring one or more imprint masks;
    detecting one or more feature profiles exhibiting a negative slope on the one or more imprint masks comprising an acute angle between a horizontal surface of the imprint mask and an outer side of at least one of the mask features; and
    altering at least one negative slope feature of at least one of the imprint masks to mitigate effects of the negative slope of the feature profiles such that wafer or mask material is mitigated from being torn loose upon removal of the at least one altered imprint mask from a wafer being imprinted therewith.

10. The method of claim 9, altering the at least one imprint mask further comprises depositing spacer oxide layer on the imprint mask.

11. The method of claim 10, further comprising providing a positive taper to the imprint mask by etching the spacer oxide layer away from horizontal and positively sloped surfaces of the mask while the oxide layer remains in negatively sloped areas of the mask.

12. The method of claim 9, further comprising detecting frequency of alteration of imprint masks.

13. The method of claim 12, further comprising adjusting original mask CD (critical dimension) to compensate for anticipated CD variation during execution of the alteration of imprint masks.

14. The method of claim 9, further comprising employing the at least one altered imprint mask for imprinting of a wafer.

* * * * *